United States Patent
Chin et al.

(10) Patent No.: US 6,484,135 B1
(45) Date of Patent: Nov. 19, 2002

(54) METHOD FOR ADAPTIVE TEST GENERATION VIA FEEDBACK FROM DYNAMIC EMULATION

(75) Inventors: Richard Chin, Los Altos, CA (US); Deb Aditya Mukherjee, Belmont, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/386,012

(22) Filed: Aug. 30, 1999

(51) Int. Cl.[7] ............... G06F 9/455; G06F 17/50; G06G 7/62
(52) U.S. Cl. ............... 703/23; 703/13; 703/15; 716/14
(58) Field of Search ............ 714/28, 738, 724; 712/1; 703/27, 13, 15, 23; 716/6, 14

(56) References Cited

U.S. PATENT DOCUMENTS

| | | | | |
|---|---|---|---|---|
| 4,594,711 A | * | 6/1986 | Thatte | 371/24 |
| 4,878,179 A | * | 10/1989 | Larson et al. | 364/490 |
| 5,570,376 A | * | 10/1996 | Kuda et al. | 371/25.1 |
| 5,933,594 A | * | 8/1999 | La Joie et al. | 395/183.01 |
| 6,108,806 A | * | 8/2000 | Abramovici et al. | 714/725 |
| 6,223,272 B1 | * | 4/2001 | Coehlo et al. | 712/1 |
| 6,332,201 B1 | * | 12/2001 | Chin et al. | 714/28 |
| 6,353,815 B1 | * | 3/2002 | Vilim et al. | 706/15 |

OTHER PUBLICATIONS

"Weighted BIST structures in arithmetic unit of communication processor" M. Martinez, IEE Proc.–Comput. Digest. Tech., vol. 142, No. 5, Sep. 1995.*
"A New Diagnosis Approach for Short Faults in Interconnects" C. Feng, IEEE 0731–3071/95, 1995.*
"Boundary Scan BIST Methodology for Reconfigurable Systems" C. Su, IEEE 0–7803–5092–8/98, 1998.*

* cited by examiner

*Primary Examiner*—Hugh M. Jones
*Assistant Examiner*—Fred O Ferris

(57) ABSTRACT

A function for adaptively generating test vectors to verify the behavior of a digital system. The function utilizes one or more user-defined verification directives for directing the generation of the test vectors to areas of interest within the digital system. An emulator of the digital system provides dynamic feedback of internal state information to the test vector generation function during the verification. The test vector generation function adaptively generates future verification test vectors based on the user-defined verification directives in view of the internal state information feedback received from the emulator.

19 Claims, 6 Drawing Sheets

METHOD FOR ADAPTIVE TEST GENERATION VIA FEEDBACK FROM DYNAMIC EMULATION

THE FIELD OF THE INVENTION

The present invention relates to digital systems, and, more particularly to an apparatus and method for adaptively generating stimulus within a digital system during a design verification operation.

BACKGROUND OF THE INVENTION

Verifying the functional correctness of complex digital systems poses a major challenge for today's verification engineers. The extremely large number of possible states present in today's complex digital systems and the fact that some of the possible states are difficult to exercise make it a practical impossibility to completely exercise all potential states. Design verification is an example of an "NP-complete problem" (i.e., the amount of resources needed to solve the problem grows as an exponent of the problem size). Two major approaches have been used to by verification engineers to verify the behavior of digital systems: 1) formal verification and 2) simulation based verification.

FIG. 1 is a simplified block diagram of a formal verification process, indicated generally at 20. Formal verification process 20 employs formal methods (e.g., mathematical models) to verify the functional correctness of a digital system 22. A verification engineer first creates a mathematical model 24 representing digital system 22, then performs a series of mathematical operations 26 on mathematical model 24 to verify digital system 22, generating a set of verification results 26. In contrast to a simulation based verification approach, formal verification process 20 provides a complete check of the design, rather than checking only data sets selected by the test engineer. Formal verification process 20 highlights subtle errors that occur under unusual circumstances, and it eliminates the time necessary to create test data (e.g., test vectors). In formal verification, there are two general types of checks that can be performed: equivalence checking and property checking.

Equivalence checking is a collection of techniques used to demonstrate that two designs are equivalent. One definition of "equivalent" states that all registers within the two designs must have the identical content, and the outputs must be identical at the end of each clock cycle. This rigid definition is limiting in practice, as the contents of the registers change slightly as the design proceeds. In an alternative less rigid definition of "equivalent", the contents of registers in a first design are a simple function of the contents of registers in a second design at the end of each clock cycle. In a yet another loose definition of "equivalent", the outputs of a first design and a second design must merely go through the same transitions over time.

Property checking encompasses a collection of techniques that allow a verification engineer to resolve design issues, such as: protocols for buses, caches, and communications links. Property checking is generally applied prior to design synthesis to check that a register transfer level (RTL) design behaves in an expected way.

Formal verification techniques are still in their infancy and are severely limited by the size of a subsystem that can be effectively verified. Thus, a simulation based verification approach is more commonly employed to verify the behavior of a complex chip (e.g., microprocessor) in a system environment having multiple interacting components.

FIG. 2 is a simplified block diagram of a simulation based verification process, indicated generally at 40. Simulation based verification process 40, verifies a digital system 42 by generating various sequences of states (also referred to as events) with a test generator 44. Examples of events include: read/write operations to various memory addresses, queues, and buffers within digital system 42. Test generator 44 generates events by creating sequences of test vectors, applying the sequences of test vectors to digital system 42 or other device under test (DUT), capturing a set of verification results 46 generated by the application of the sequences of test vectors, and determining whether the responses to the applied test vectors (i.e., verification results 46) are correct. A simulation based verification, such as simulation based verification process 40, typically employs an exhaustive 48, random 50, and/or directed random 52 testing methodology.

Generating an exhaustive set of test vectors 48 is often impractical to cover the complexity found in modem digital systems. The generation of a set of random test vectors 50 often creates a "scattergun" effect, where the most critical areas of the design receive no more testing than less critical areas of the design.

As a result, some test generators, such as test generator 44, create a set of directed random test vectors controlled by a set of user-defined verification directives 54. The set of verification directives "directs" the generation of test vectors to test areas of particular interest in digital system 42. One example, user-defined verification directive within a configuration file provides a specific range of addresses (i.e., address distribution) within the system where the test vectors are to be directed, as indicated at 56. Another example user-defined verification directive specifies that instructions of a specific type be used during the verification, as indicated at 58. Another example user-defined verification directive specifies the ratio of read and write operations to be performed during testing, as indicated at 60. These user-defined verification directives 54 serve as fine tuning "knobs" for the test generation process.

In such an environment, the test generator operates in an essentially nonadaptive mode where user-defined verification directives 54 are assigned a priori and no feedback is obtained from digital system 42 to determine if an event was hit or is likely to be hit. In other words, the fine tuning "knobs" (i.e., user-defined verification directives) are locked into position before the verification process begins, and remain unalterable throughout the verification process. Thus, the non-adaptive nature of the test generation process results in unnecessarily long test sequences, manual intervention, and low event coverage.

In view of the above, there is a need for a function to adaptively generate test vectors based on feedback of internal state information represented within digital system during verification. The function should utilize a set of user-defined verification directives for directing the generation of the test vectors to areas of interest within the digital system in view of the internal state information received from the digital system.

SUMMARY OF THE INVENTION

The present invention provides an apparatus for adaptively generated test vectors used to verify the behavior of a digital system. The functional testing system includes a hardware model representing a relatively low-level software characterization of the digital system. The functional testing system also includes a hardware emulator representing a relatively high-level software characterization of the digital system. The hardware emulator is capable of dynamically representing internal model state information. The functional testing system further includes a test generator for generating and applying a plurality of input vectors to the hardware model and the hardware emulator to produce a directed behavior. Finally, the functional testing system includes one or more verification directives which characterize attributes desired in the functional testing system and which direct the behavior of the test generator. The test generator accesses the internal model state information represented within the hardware emulator to adaptively generate the plurality of input vectors as directed by the one or more verification directives.

In one embodiment, the adaptively generated plurality of input vectors may generate one or more transactions within the hardware model. In some instances, the generated transactions are related, and form an ordered sequence of transactions. The adaptively generated input vectors may produce transactions which conflict with a pending internal state of the digital system.

In one embodiment, the functional testing system of the present invention includes queue management directives, address conflict directives, and system behavior directives. In one embodiment of the present invention, the test generator accesses the internal model state information represented within the emulator via a software procedural interface.

In one embodiment, the present invention also provides a method for adaptively generate test vectors to verify the behavior of a digital system. The method begins by defining a hardware model representing a relatively low-level software characterization of the digital system. Next, a hardware emulator is defined which represents a relatively high-level software characterization of the digital system, wherein the hardware emulator is capable of dynamically representing internal model state information. A plurality of input vectors is then generated to produce a directed behavior within the hardware model. The generation utilizes the internal model state information represented within the hardware emulator. Finally, the plurality of input vectors is applied to the hardware emulator and hardware model, producing the directed behavior.

In one embodiment, the adaptively generated plurality of input vectors generates one or more transactions within the hardware model. In some instances, the generated transactions are related, and form an ordered sequence of transactions. In some instances, the adaptively generated input vectors produce transactions which conflict with a pending internal state of the digital system. The functional testing system of the present invention includes queue management directives, address conflict directives, and system behavior directives.

In one embodiment, the present invention further provides a computer readable medium containing instructions for controlling a computer system to perform a method for adaptively generating test vectors for verifying the behavior of a digital system. The method begins by defining a hardware model representing a relatively low-level software characterization of the digital system. Next a hardware emulator is defined representing a relatively high-level software characterization of the digital system, where the hardware emulator is capable of dynamically representing internal model state information. A plurality of input vectors is then generated to produce a directed behavior within the hardware model. The generation utilizes the internal model state information represented within the hardware emulator. Finally, the plurality of input vectors are applied to the hardware emulator and the hardware model, producing the directed behavior.

The present invention offers several advantages over current functional testing systems for verifying the behavior of a digital system. The present invention provides both a relatively low-level hardware model and a relatively high-level hardware emulator for representing the digital system both structurally and behaviorally during the verification process. By dynamically monitoring feedback of internal state information from the hardware emulator during the verification process, the test generator of the present invention utilizes a set of user-defined verification directives in conjunction with the state information feedback to adaptively generate test vectors to test areas of interest within the digital system. This adaptive generation of test vectors found within the current invention requires less overhead and is easier to maintain than non-adaptive test generation systems currently in use.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
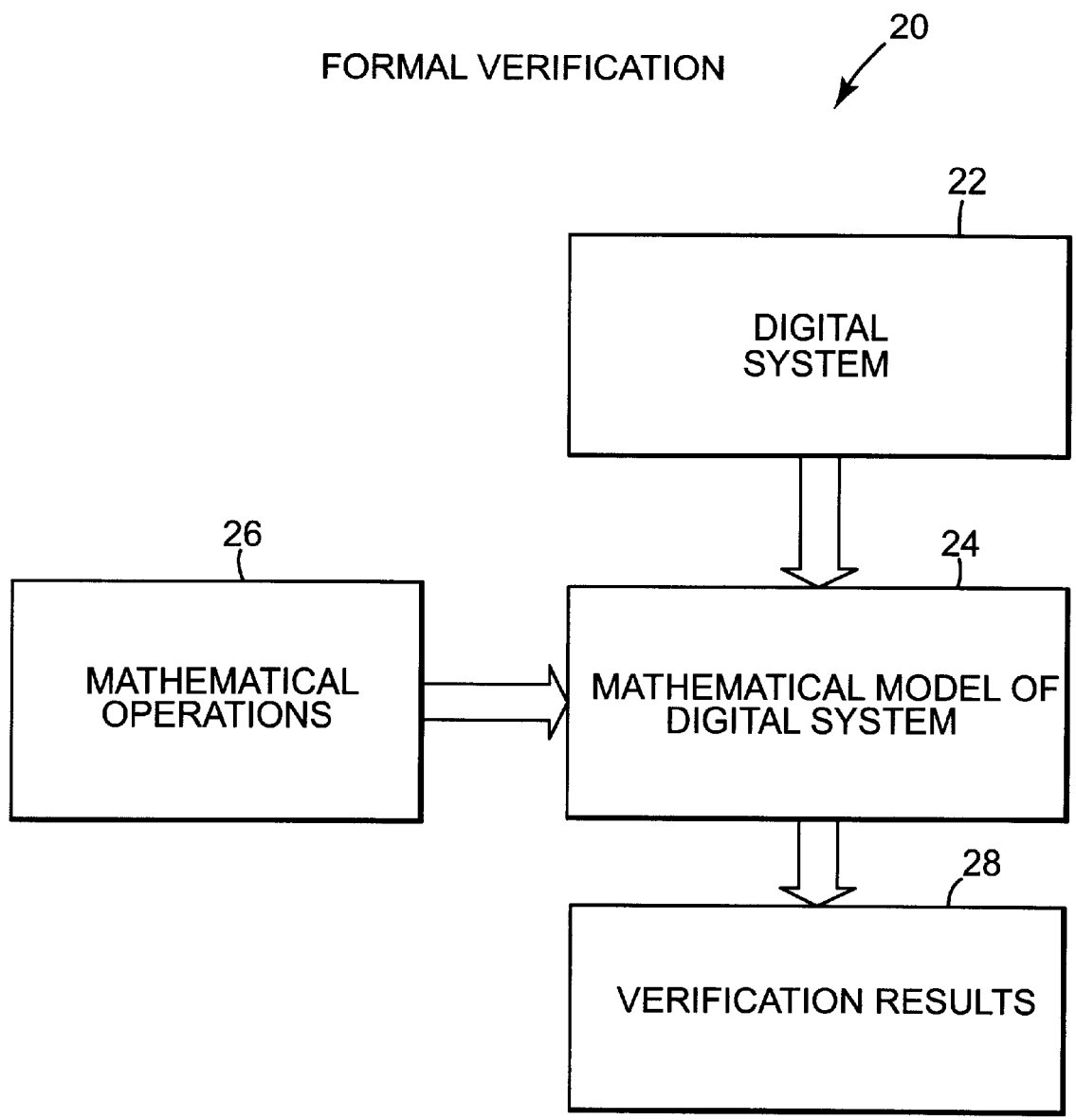
FIG. 1 is a block diagram illustrating a prior art formal verification process employed to verify digital systems.
Figure 2:
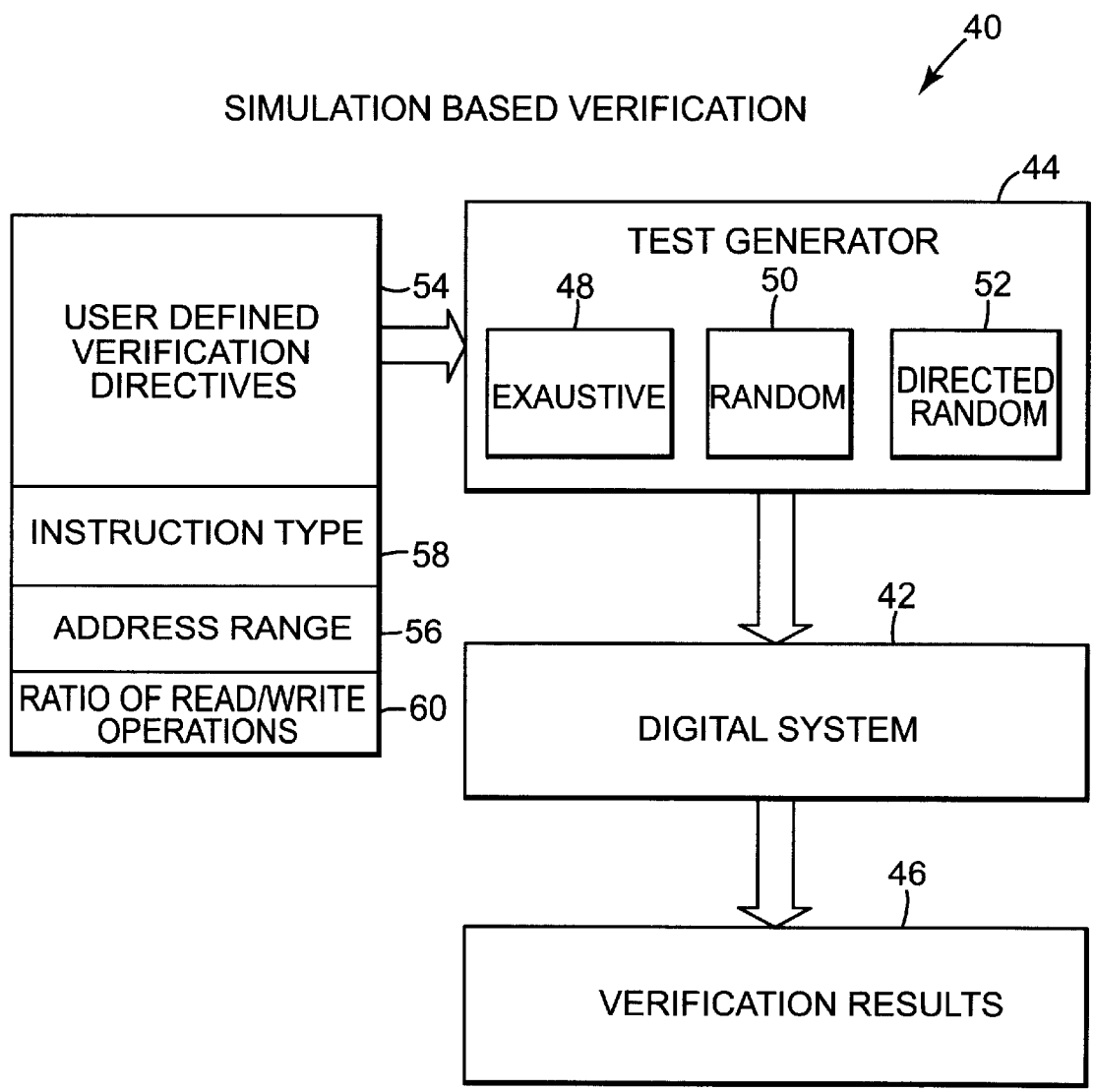
FIG. 2 is a prior art block diagram illustrating a simulation based verification methodology employed to verify digital systems.
Figure 3:
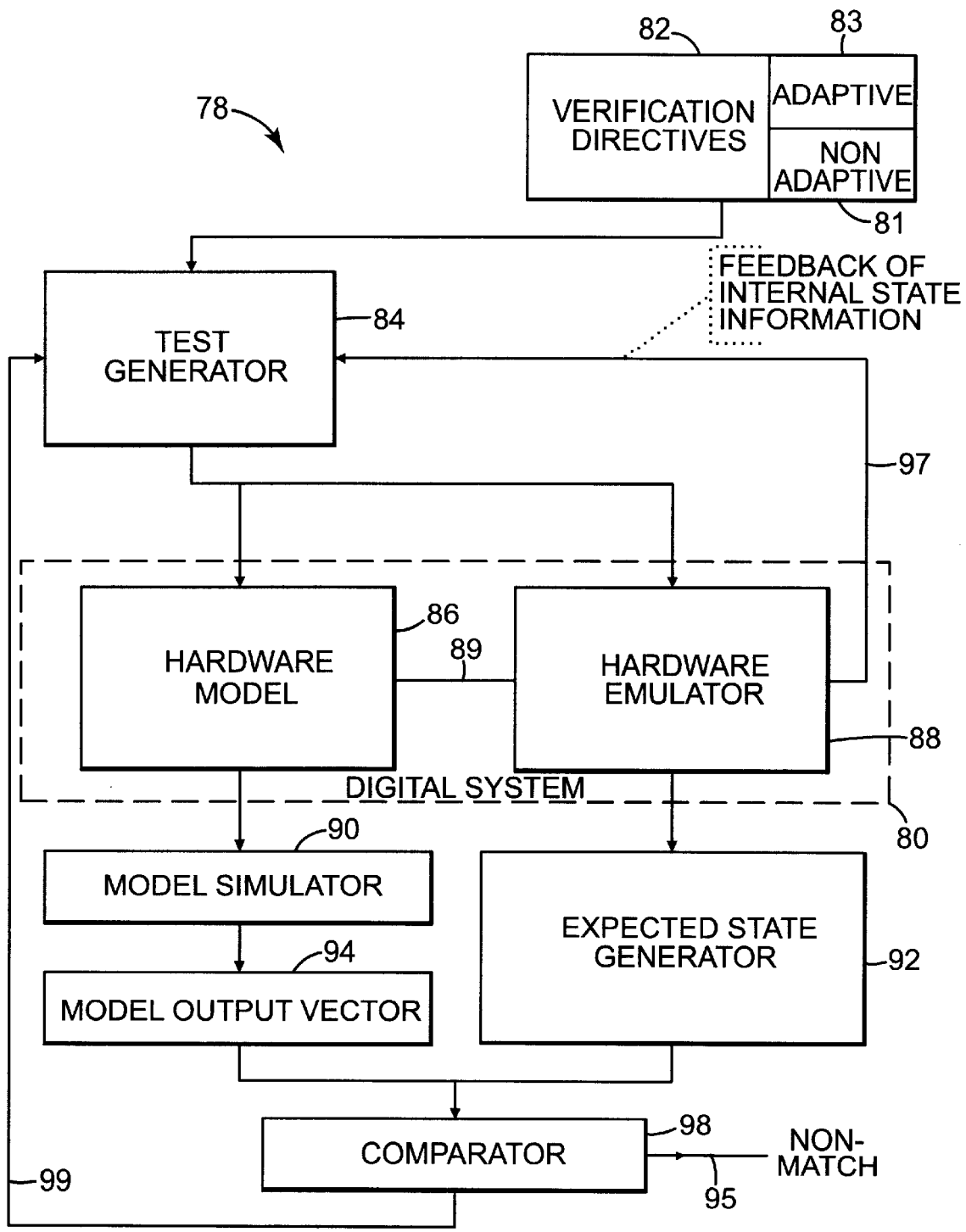
FIG. 3 is a block and flow diagram illustrating an apparatus for adaptive test generation in accordance with the present invention.

FIG. 3 is a block and flow diagram of a functional testing and verification environment for adaptive test generation in accordance with the present invention, illustrated generally at 78. Functional testing and verification environment 78 verifies a digital system 80 by generating various sequences of states (also referred to as events) with a test generator 84. Verification directives 82 enable test generator 84 to generate test vectors to produce events specifically directed at areas of particular interest in digital system 80.

Verification directives 82 include non-adaptive verification directives 81 and adaptive directives 83. Non-adaptive verification directives 81 cause test generator 84 to operate in an essentially non-adaptive mode where the user-defined non-adaptive verification directives are assigned a priori and no feedback is obtained from digital system 80 during the verification process to determine if an event was hit or is likely to be hit.

Adaptive verification directives 83 enable test generator 84 to tailor the generation of future test vectors based on feedback of current internal model state information 97 represented within digital system 80. In other words, non-adaptive verification directives 81 drive the generation of test vectors in test generator 84 independent of any current internal model state information of digital system 80, while adaptive verification directives 83 rely on feedback of current internal state information from digital system 80 in order to drive the generation of future test vectors.

Test generator 84 generates test vectors which are concurrently applied to both a hardware model 86 and a hardware emulator 88 of digital system 80. Hardware model 86 is a relatively detailed, low-level software characterization of the corresponding digital system. Hardware model 86 is written in a hardware description language (HDL) such as Verilog or VHDL. Hardware model 86 is later synthesized and processed to form one or more integrated circuit chips implementing containing the digital system.

In contrast to hardware model 86, hardware emulator 88 is a relatively high-level (i.e., behavioral) software characterization of digital system 80. Hardware emulator 88 is a software module whose behavior matches the corresponding digital system 80, but whose implementation is simpler than hardware model 86. Hardware emulator 88 provides access to internal state information during the verification process via a software procedural interface. This internal state information is directed back to test generator 84 during the verification process in order to drive the adaptive generation of future test vectors specified by verification directives 82.

While internal state information is also available within hardware model 86 during the verification process, the internal state information residing with hardware emulator 88 is more readily accessible. Hardware emulator 88 only functionally represents digital system 80, while hardware model represents a physical implementation of digital system 80. Since hardware emulator 88 is organized functionally, a software construct can be employed to easily access functional components of hardware emulator 88. As an example, internal state information residing within hardware model 86 for a 32-bit bus is accessible only on a bit-wise basis, requiring 32 separate accesses, while internal state information for the same 32-bit bus residing within hardware emulator 88 is accessible via a single operation via a software construct. Hardware emulator 88 monitors the internal model state information of hardware model 86 via path 89 to ensure that the hardware model and the hardware emulator remain synchronized throughout the verification process.

Additionally, physical design changes typically occur more often than functional design changes. Therefore, it is much more difficult to maintain the latest design changes within hardware model 86 than within hardware emulator 88. As a result, hardware emulator 88 is more likely to accurately represent the current functional state of the design for verification purposes.

Hardware emulator 88 is written in any number of programming languages, such as C, C++, and PASCAL, and can be written in a hardware description language, such as Verilog or VHDL. Unlike hardware model 86, hardware emulator 88 does not suffer from constraints of the physical implementation, such as silicon area. Hardware emulator 88 also has no obligation to meet any physical constraints.

Functional testing and verification environment 78 further includes a model simulator 90 and an expected state generator 92. Model simulator 90 simulates the operation of digital system 80 by serially passing simulation input vectors through hardware model 86 to produce a single model output vector 94 for each input vector passed through model simulator 90. Model simulator 90 can be any of a number of commercially available functional simulators. In a preferred embodiment, model simulator 90 is a Verilog type simulator. Verilog is an IEEE standard hardware description language that is maintained by the Design Automation Standards Committee.

Expected state generator 92 simulates the operation of hardware emulator 88 by serially passing simulation input vectors through the hardware emulator to produce a result for each simulation input vector passed through hardware emulator 88. If multiple results from expected state generator 92 are consistent with the specification of corresponding digital system 80 for a given simulation input vector, hardware emulator produces all of the results which represent legitimate possibilities for the given simulation input vector.

A comparator 98 compares the model output vector 94 generated by the simulation of hardware model 86 with the results of expected state generator 92. If the model output vector 94 does not match any of the results from the expected state generator 92, comparator 98 activates a non-match signal as indicated at 95. An exception handler (not shown) raises an exception in response to the activated non-match signal, and attempts to continue the verification of digital system 80. If the verification cannot be continued, verification of digital system 80 is then terminated. Alternatively, if the model output vector 94 matches the results from expected state generator 92, comparator 98 provides a current matching output vector and the verification operation continues via return path 99.

Figure 4:
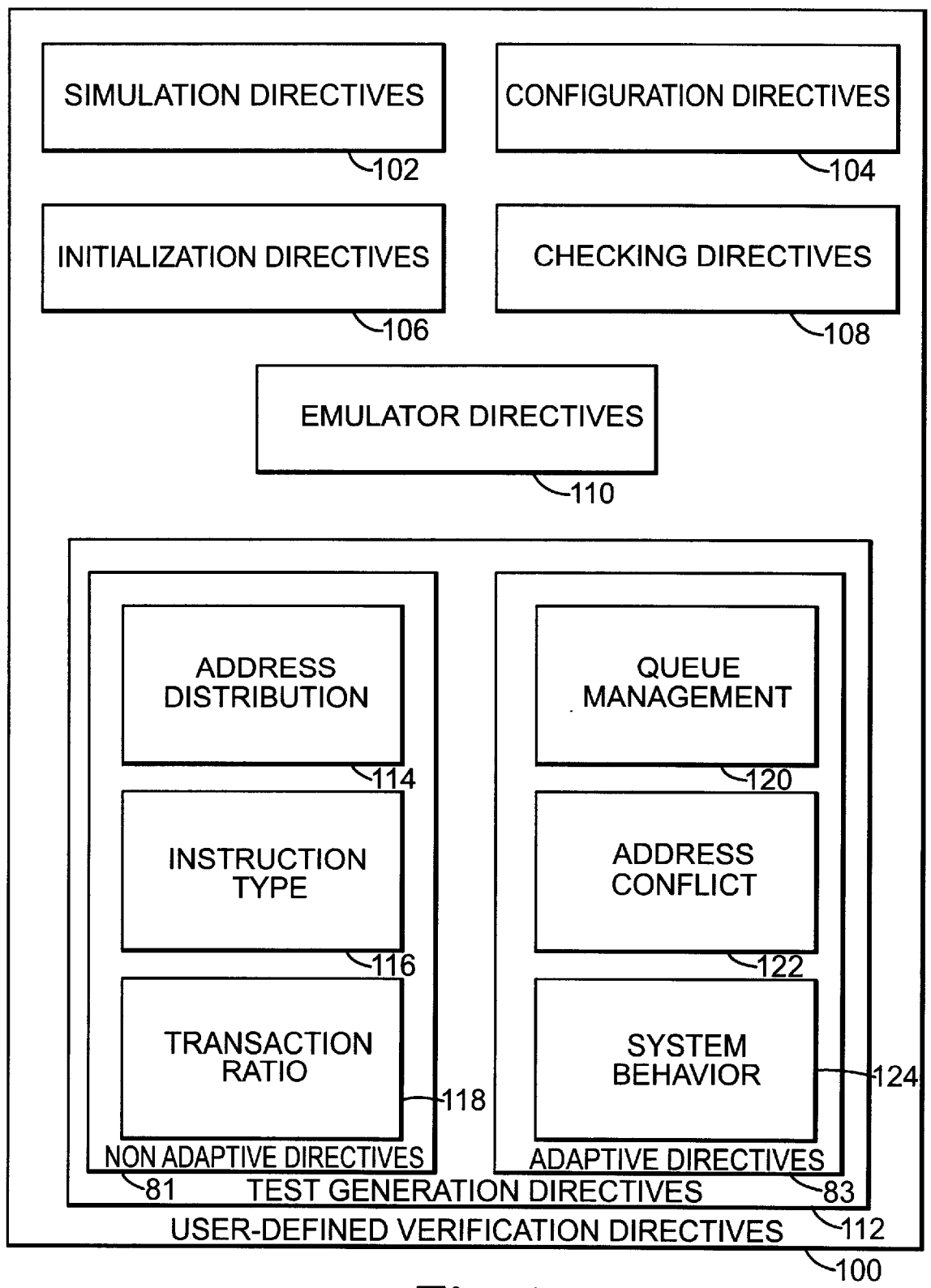
FIG. 4 is a hierarchical block diagram of user-defined verification directives which control the generation of test vectors.

FIG. 4 is a hierarchical block diagram of user-defined verification directives 100 which direct the generation of test vectors during a design verification process accordingly to the present invention. Examples of user-defined verification directives 100 include, but are not limited to: simulator directives 102, configuration directives 104, initialization directives 106, checking directives 108, emulator directives 110 and test generation directives 112. Test generation directives 112 are of particular interest within the scope of the present invention, and will be discussed in more detail below.

Test generation directives 112 include both non-adaptive (i.e., simple) verification directives 81 and adaptive (i.e., complex) verification directives 83. As described earlier, non-adaptive verification directives "direct" the generation of test vectors to test areas of particular interest in digital system 80, independent of any current internal state information represented within digital system 80. In contrast, adaptive verification directives 83 enable test generator 84 to tailor the generation of future test vectors based on feedback of current internal model state information within digital system 80 generated from previous test vectors.

Examples of non-adaptive verification directives 81 include, but are not limited to: address distribution directive 114, instruction type directive 116, and transaction ratio directive 118. Address distribution directive 114 instructs test generator 84 to direct test generation activities toward addresses residing within predefined regions of digital system 80 in a predetermined ratio. One example of an address distribution directive is as follows:

address_distribution {region_0 1}
    {region_1 0}
    {region_2 4}

In this example address distribution, digital system 80 includes three regions: region_0, region_1, and region_2. Each region is followed by a relative weighting number which assigns the probability of choosing an address within the region during the test generation process. The probability of selecting an address within each region is defined by the following function:

relative weighting number (selected region)/sum of all weighting nos.

Thus, in the example address distribution, the likelihood of test generator 84 selecting an address in region_0 is 0.2 (20%), in region_1 is 0.0 (0%), and in region_2 is 0.8 (80%). The preceeding address distribution example represents only one of many possible ways of defining distribution values within the scope of the present invention, and is offered here for illustrative purposes.

Instruction type directive 116 instructs test generator 84 to enable/disable selected instruction types from a particular address region during the verification process. An example of an instruction type directive is as follows:

disallow region_2 read

In this example instruction type directive, instruction type directive 116 instructs test generator 84 to exclude "read" transactions from region_2 during the verification process.

Transaction ratio directive 118 establishes a transaction mix for the verification via a specified transaction ratio. An example of a transaction ratio directive is as follows:

request_length {0 10} {1 5} {3 40}

In this transaction ratio example, the first value in each ordered pair represents a numeric representation of a transaction type. For instance, "0" represents a zero length transaction, "1" represents a 1–8 byte transaction, and "3" represents a 64 byte transaction. The second value in each ordered pair is a relative weighting for each transaction type. The probability of selecting each transaction type is defined by the following function:

relative weighting number (transaction type)/sum of all weighting nos.

Thus, in this example transaction ratio, the probability of selecting a zero length transaction type is (10/55) or approximately 18%. Likewise, the probability of selecting a transaction type having a request length of 1–8 bytes is (5/55) or approximately 9%. Finally, the probability of selecting a transaction type having a request length of 64 bytes is (40/55) or approximately 73%.

Examples of adaptive verification directives 83 include, but are not limited to: queue management directive 120, address conflict directive 122, address range directive 124, and system behavior directive 124. Queue management directive 120 directs test generator 84 to maintain a specified queue at a specified capacity during the verification process. Unlike the non-adaptive directives 81 discussed above, adaptive queue management directive 120 relies on feedback from hardware emulator 88 during the verification process in order to maintain the specified queue at the specified level.

Address conflict directive 122 directs test generator 84 to either create or avoid address conflicts within digital system 80. By creating address conflicts, a verification engineer is able to effectively "stress test" digital system 80. For example, a verification engineer can read the value of an address where a write operation is already pending. In contrast, a verification engineer can purposefully avoid address conflicts when a design is evolving. Below is an example procedure for avoiding an address conflict:

Step 1- Select an address for a proposed transaction (named address a)
    Step 2- Call an emulator based procedure to determine if a conflict exists:
        hit_status=find_address_conflict (address a)
    Step 3- Return a "0" if no conflict, return a "1" if a conflict exists
    if (hit_status) {
        try_again;
    } else {
        /* Proceed */
    }

Below is an example procedure for generating an address conflict:

Step 1- Select an address for a proposed transaction (named address b)
    Step 2- Call an emulator based procedure to determine if a conflict exists:
        hit_status=find_address_conflict (address a)
    Step 3- Return a "0" if no conflict, return a "1" if a conflict exists
    if (hit_status) {
        /* Proceed */
    } else {
        try_again;
    }

Unlike the relatively simple address conflict directive 122, in some instances, a relatively complex sequence of ordered transactions are required to generate a behavior within digital system 80. System behavior directive 124 directs the test generator to generate such a complex sequence of ordered transactions to generate a specific behavior within digital system 80.

Figure 5:
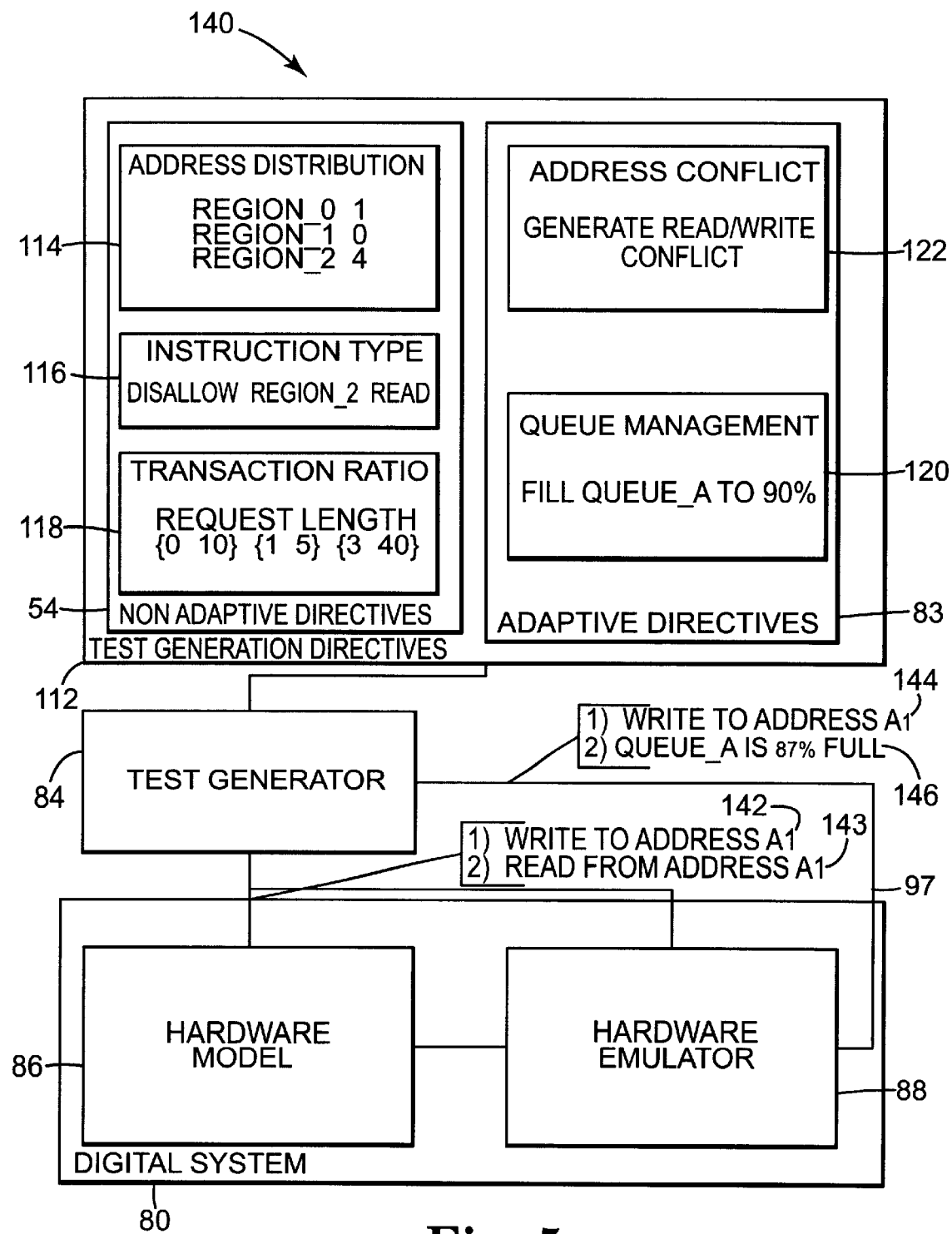
FIG. 5 is a block and flow diagram illustrating an example adaptive test generation in accordance with the present invention.

FIG. 5 is a block and flow diagram illustrating an example adaptive test generation sequence 140 in accordance with the present invention. A set of test generation directives 112 direct the generation of vectors within test generator 84. In the illustrated example adaptive test generation sequence 140, both non-adaptive verification directives 81 and adaptive verification directives 83 are concurrently utilized by test generator 84. In other words, non-adaptive verification directives 81 and adaptive verification directives 83 are not mutually exclusive, but may collectively direct the generation of test vectors by test generator 84. In the illustrated example adaptive test generation sequence 140, non-adaptive verification directives 81 include an address distribution directive 114, an instruction type directive 116, and a transaction ratio directive 118. Address distribution directive 114 specifies to test generator 84 that test vectors are to be directed to region_0 addresses approximately 20 percent of the time, and to region_2 addresses approximately 80 percent of the time. Instruction type directive 116 specifies that there are to be no read operations directed to region_2 during the verification. Transaction ratio directive 118 specifies that test generator 84 generate 0 length transactions approximately 18 percent of the time, transactions of length 1–8 bytes approximately 9 percent of the time, and transactions of length 64 bytes approximately 73 percent of the time.

Adaptive verification directives utilized by test generator 84 include address conflict directive 122 and a queue management directive 120. Address conflict directive 122 specifies that a write/read address conflict is desired within digital system 80. Queue management directive 120 specifies that queue_A is to be filled to 90% of capacity during the verification process.

Test generator 84 receives test generation directives 112 and generates a corresponding set of test vectors based on the directives. In the illustrated example adaptive test generation sequence 140, the first transaction of test generator 84 involves a write to address $A_1$, as indicated at 142. Test generator 84 then applies the set of test vectors used to generate the first transaction concurrently to both hardware model 86 and hardware emulator 88. As a result of the application of the test vectors of the first transaction to hardware emulator 88, internal state information within hardware emulator 88 is updated and returned to test generator 84 via path 97.

This internal state information on path 97 indicates that a write operation is currently pending at address $A_1$, as indicated at 144, and that queue_A is currently 87% full, as indicated at 146. Test generator 84 receives the internal state information from hardware emulator 88, then analyzes adaptive directives 120 and 122 in order to determine the next transaction to generate. In this instance, test generator 84 knows that there is a pending write operation occurring at address $A_1$, as indicated at 142, and that a write/read address conflict directive is desired, as indicated at 122. As a result, test generator 84 generates a transaction which causes a read to occur at address $A_1$, as indicated at 143.

Additionally, internal model state information indicates that queue_A is currently only 87% full, and that there is an adaptive test generation directive 120 in force which specifies that queue_A should be 90% full. As a result, the test vectors generated in subsequent transactions are directed toward filling up queue_A to 90% of capacity. This adaptive test generation directive 120 is an example of a multiple-event directive, since it may take several transactions (i.e., events) from test generator 84 in order to fill queue_A to the 90% capacity specified in adaptive directive 120.

Figure 6:
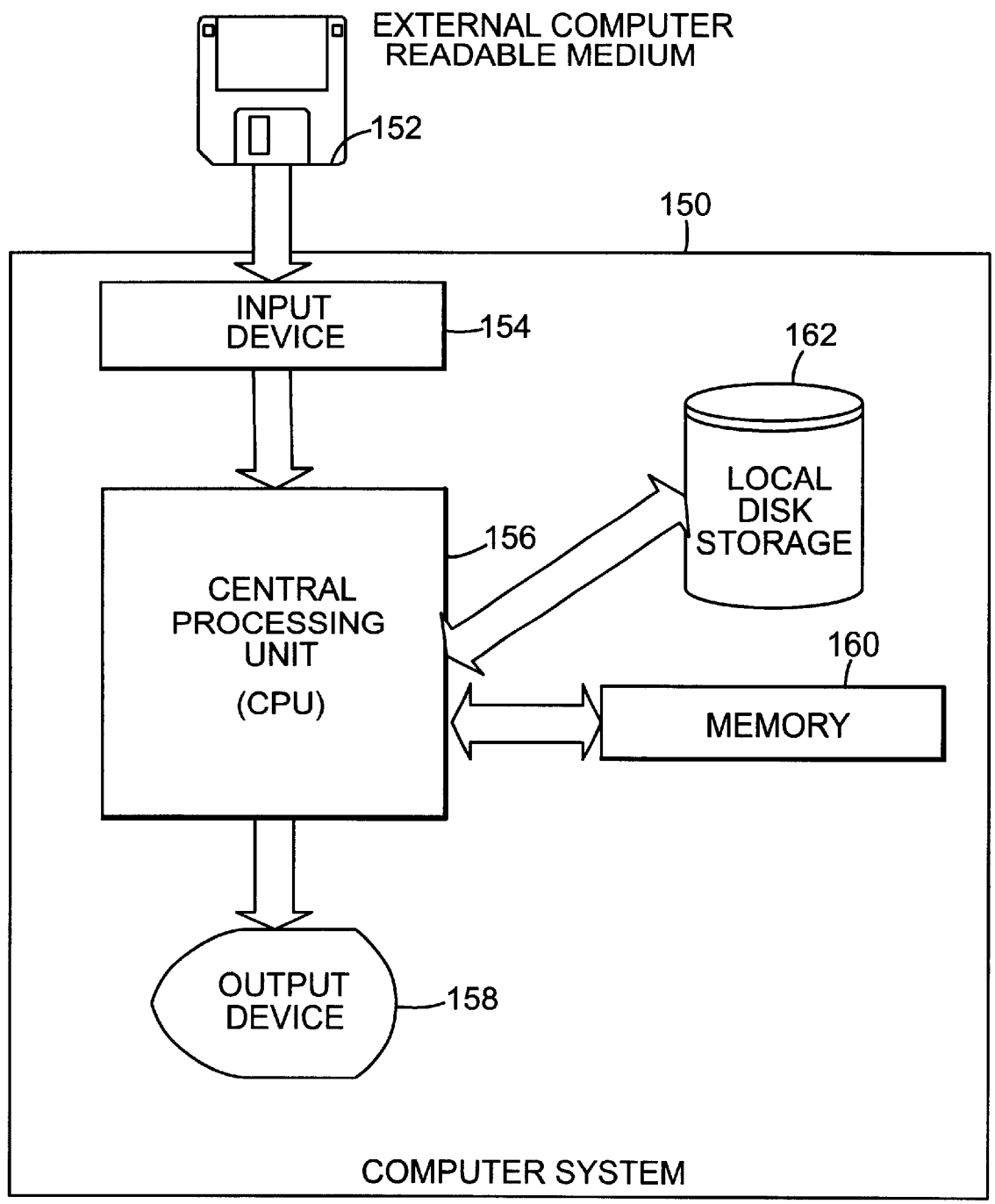
FIG. 6 is a block diagram of a computer system and a corresponding computer readable medium incorporating the adaptive test generation system of the present invention.

FIG. 6 illustrates a computer system 150 and an external computer readable medium 152 incorporating functional testing and verification environment (FIG. 3, element 78) in accordance with the present invention. Embodiments of external computer readable medium 152 include, but are not limited to: a CD-ROM, a floppy disk, and a disk cartridge. Functional testing and verification environment (FIG. 3, element 78) of the present invention can be implemented in a variety of compiled and interpreted computer languages. External computer readable medium 152 stores source code, object code, executable code, shell scripts and/or dynamic link libraries for functional testing and verification environment (FIG. 3, element 78). An input device 154 reads external computer readable medium 152 and provides this data to computer system 150. Embodiments of input device 154 include but are not limited to: a CD-ROM reader, a floppy disk drive, and a data cartridge reader.

Computer system 150 includes a central processing unit 156 for executing functional testing and verification environment (FIG. 3, element 78) according to the present invention. Computer system 150 also includes local disk storage 162 for locally storing the functional testing system before, during and after execution. Functional testing and verification environment (FIG. 3, element 78) also utilizes memory 160 within the computer system during execution. Upon execution of functional testing and verification environment (FIG. 3, element 78), output data is produced and directed to an output device 158. Embodiments of output device 158 include, but are not limited to: a computer display device, a printer, and/or a disk storage device.

The present invention provides key advantages over presently available tools and methods for verifying the behavior of a digital system 80. The present invention provides a hardware model 86 representing a relatively low-level characterization of digital system 80, and a hardware emulator 88 representing a relatively high-level characterization of digital system 80. The present invention also provides a test generator 84 which generates and concurrently applies test vectors to hardware model 86 and hardware emulator 88 to produce a directed behavior. Internal state information from hardware emulator 88 is returned to test generator 84 during the verification process via a feedback loop. One or more user-defined verification directives 82 are provided to characterize attributes desired in the verification process, and direct the verification process. Verification directives 82 utilize the internal state information feedback from hardware emulator 88 to adaptively generate subsequent test vectors within test generator 84.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the electrical and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An apparatus for adaptively generating test vectors used to verify the behavior of a digital system, the apparatus comprising:

a hardware model representing a relatively low-level software characterization of the digital system;

a hardware emulator representing a relatively high-level software characterization of the digital system, wherein the hardware emulator is capable of dynamically representing internal model state information;

a test generator for generating and applying a plurality of input vectors to the hardware model and the hardware emulator to produce a directed behavior; and one or more verification directives which characterize attributes desired in the functional testing system and which direct the behavior of the test generator, wherein the test generator accesses the internal model state information represented within the hardware emulator to adaptively generate the plurality of input vectors as directed by the one or more verification directives.

2. The apparatus of claim 1, wherein the adaptively generated plurality of input vectors generate one or more transactions within the hardware model.

3. The apparatus of claim 2, wherein the one or more transactions are related.

4. The apparatus of claim 3, wherein the one or more related transactions comprise an ordered sequence of transactions.

5. The apparatus of claim 1, wherein the adaptively generated input vectors produce transactions which conflict with a pending internal state of the digital system.

6. The apparatus of claim 1, wherein the one or more verification directives include a queue management directive.

7. The apparatus of claim 1, wherein the one or more verification directives include an address conflict directive.

8. The apparatus of claim 1, wherein the one or more verification directives include a system behavior directive.

9. The apparatus of claim 1, wherein the test generator accesses the internal model state information via a software procedural interface.

10. A method for adaptively generating test vectors to verify the behavior of a digital system, the method comprising:

defining a hardware model representing a relatively low-level software characterization of the digital system;

defining a hardware emulator representing a relatively high-level software characterization of the digital system, wherein the hardware emulator is capable of dynamically representing internal model state information;

generating a plurality of input vectors to produce a directed behavior within the hardware model, wherein the generation utilizes the internal model state information represented within the hardware emulator; and applying the plurality of input vectors to the hardware emulator and the hardware model, producing the directed behavior.

11. The method of claim 10, wherein the plurality of input vectors generate one or more transactions within the hardware model.

12. The method of claim 11, wherein the one or more transactions are related.

13. The method of claim 12, wherein the one or more related transactions comprise an ordered sequence of transactions.

14. The method of claim 10, wherein the generation utilizes one or more verification directives which characterize attributes desired in the functional testing system, and which direct the behavior of the generation.

15. The method of claim 14, wherein the plurality of input vectors produce transactions which conflict with a pending internal state of the digital system.

16. The method of claim 14, wherein the verification directives include a queue management directive.

17. The method of claim 14, wherein the verification directives include an address conflict directive.

18. The method of claim 14, wherein the verification directives include a system behavior directive.

19. A computer readable medium containing instructions for controlling a computer system to perform a method for adaptively generating test vectors for verifying the behavior of a digital system, comprising the steps of:

defining a hardware model representing a relatively low-level software characterization of the digital system;

defining a hardware emulator representing a relatively high-level software characterization of the digital system, wherein the hardware emulator is capable of dynamically representing internal model state information;

generating a plurality of input vectors to produce a directed behavior within the hardware model, wherein the generation utilizes the internal model state information represented within the hardware emulator; and applying the plurality of input vectors to the hardware emulator and the hardware model, producing the directed behavior.

* * * * *